July 2, 1929. W. G. CADY Re. 17,356

PIEZO ELECTRIC RESONATOR

Original Filed Jan. 28, 1920

INVENTOR
WALTER G. CADY
by David Rines
ATTORNEY

Reissued July 2, 1929. Re. 17,356

UNITED STATES PATENT OFFICE.

WALTER G. CADY, OF MIDDLETOWN, CONNECTICUT, ASSIGNOR TO RADIO CORPORATION OF AMERICA, A CORPORATION OF DELAWARE.

PIEZO-ELECTRIC RESONATOR.

Original No. 1,450,246, dated April 3, 1923, Serial No. 354,659, filed January 28, 1920. Application for reissue filed August 6, 1925. Serial No. 48,678.

DIVISION B.

The present invention relates to electrical systems, and more particularly to electric wave or frequency meters.

A chief object of the invention is to provide a new and improved method of, and apparatus for, measuring electric wave lengths or frequencies.

With this and other objects in view, the invention consists of the improved wave-length or frequency meter hereinafter described, illustrated in the accompanying drawings, and defined in the appended claims.

Figure 1:
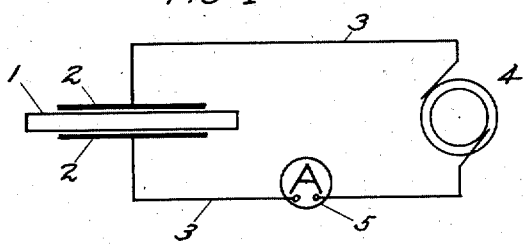

In the accompanying drawings, Fig. 1 is a diagrammatic view of a circuit and apparatus illustrating the principles underlying the present invention; and Figs. 2 to 6, inclusive, are similar views illustrating several forms of the invention.

For many years it has been known that quartz, tourmaline and certain other crystals, if compressed or otherwise strained in certain directions, respond electrically, so as to exhibit positive and negative electrification in certain regions on their surfaces. It has also been known that the converse effect obtains, that is to say, that such crystals, when electrically stimulated, as by being placed in an electric field, become deformed. This phenomenon has been known as piezo-electricity. In the specifications and the claims, the action of the electric forces to cause mechanical deformation will, for brevity, be called "stimulation"; and the development of the electromotive force by the deformation will be called "response". A large number of both natural and artificial crystals have been found to possess this piezo-electric property. The general knowledge on the subject has so far developed that it is now possible to predict in advance whether a given crystal will show the piezo-electric effect, and in what manner a plate or rod should be cut from the crystal in order to exhibit this effect to the greatest possible degree.

The crystal that has been most commonly employed in piezo-electric experiments, in the past, has been quartz, as a rule, investigators have used thin, flat plates or rods 1 of quartz, rectangular in cross section, and coated on their opposite faces with tinfoil coatings 2, Fig. 1.

As is explained in my application, Serial No. 20,277, filed April 2, 1925, for reissue of my Letters Patent, No. 1,450,246, of which my present application is a division, a plate or rod 1, Fig. 1, suitably cut from a piezo-electric crystal according to approved practice, and provided with conductive coatings 2 that are connected with a source of high-frequency current 4 by conductors 3, as shown in Fig. 1, becomes set into vibration at various frequencies of the alternating current. The amplitude of such forced vibrations is exceesingly minute, except when the frequency of the current approximates a natural frequency of mechanical vibration of the plate. Even at this natural frequency the changes in the dimensions of the plate resulting from its forced vibrations are so minute as to escape detection under ordinary conditions. They are nevertheless sufficient to exert a marked reaction upon the electric current. At approximately the critical frequency, the absorption of energy in the plate causes the current in the circuit to pass through a minimum. If the frequency of the current be increased, for example, then the current traversing the circuit, as measured by an ammeter 5, in series with the coatings, will be found to pass through a maximum at a frequency slightly below the resonant frequency, followed by a minimum at a frequency slightly above the resonant frequency. If the frequency be decreased, this process will be reversed. The reactions of the crystal upon the current are such that, with a tube-generating circuit, as commonly employed, it is usually impossible to make the circuit oscillate at exactly the natural frequency of vibration of the crystal when the crystal is connected directly in the circuit, but the frequency at which the above-mentioned minimum occurs is so close to the natural frequency that, for most practical purposes, it may be regarded as the natural frequency of the crystal. The theory will be found explained at greater length in the above-named application and in my paper in the Proceedings of the Institute of Radio Engineers, vol. 10, April, 1922.

When the plate is made from a piezo-electric crystal of good elastic qualities, such as quartz, when its width is small in comparison with its length, and it is mounted in such manner that its vibrations will be damped as little as possible, the reaction is extremely sharp and very pronounced. Such a plate, connected to a source of electric oscillations of variable frequency, will respond when one and only one frequency—neglecting for the moment overtones—is being generated. It forms a piezo-electric resonator, somewhat analogous to the acoustical resonators of Helmholtz. If the natural frequency of the plate has been determined by comparison with a standard wave-meter, or otherwise, it may be, in turn, used as a standard for calibrating radio and other high-frequency circuits, and a number of such plates, of different lengths, may be used for calibrating a high-frequency circuit over as wide a range as desired.

It is not necessary that the device comprise a long, narrow plate, although this has its advantages in permitting greater sharpness of tuning, and in securing greater freedom from effects that might be produced by undesired modes of vibration. The plate may have various shapes, or some other form than a plate may be used, including the entire native crystal itself. In fact, it is within the scope of the present invention to use other electro-mechanical vibrators than piezo-electric crystals. The only essential condition is that the vibrator shall be mounted and connected to an oscillating circuit of variable frequency in such a manner as to react electrically upon such circuit at a particular frequency. In general, the more complicated the form, the more numerous are the frequencies to which the unit will respond.

Figure 2:
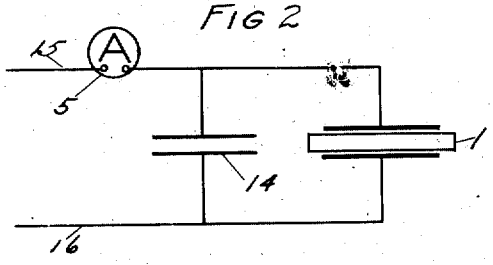

According to the present invention, the piezo-electric resonator is used as a standard of frequency or wave length, particularly in high-frequency circuits. In Fig. 2, for example, the piezo-electric resonator 1 is connected in parallel with a condenser 14, which may form part of any tuned oscillatory circuit in which alternating current of variable frequency is flowing. The wires 15 and 16 connect the condenser 14 with the remainder of the circuit, through an ammeter 5. At a critical frequency, the absorption of energy in the piezo-electric resonator causes the current in the ammeter to pass through a minimum. This decrease in current is the greater, the smaller the capacity of the condenser with respect to that of the resonator.

Figure 5:
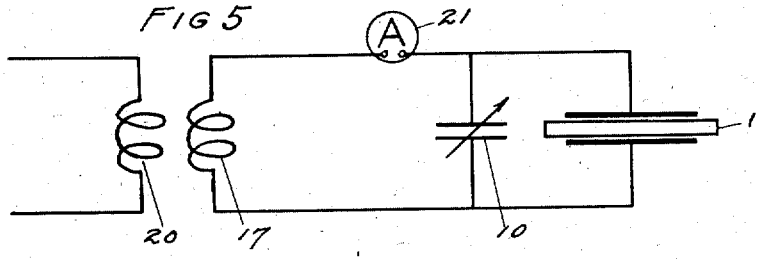

The current flowing to the crystal body does not usually sink to a simple minimum at resonance, but as the frequency is increased, it passes through a maximum, followed by a minimum, with a possible secondary maximum and minimum lying in-between. In Fig. 5, the current passes through a minimum at resonance in the ammeter 21, and also in the condenser 10. This is explained in my said paper in the Proceedings of the Institute of Radio Engineers, pages 99 to 101.

Also this figure indicates one way in which the piezo-electric resonator may be made to serve as a standard of frequency or of wave length in radio-telegraphy. It is only necessary to connect several such resonators, in succession, in place of that shown, each time making note of the readings of the condenser or other apparatus at the critical frequency.

A resonator, when used as a frequency standard, should not be connected in series with the oscillating circuit, since its capacity is so small that it would destroy the tuning. It is usually connected in parallel with the tuning condenser. The alternating current traversing the circuit thus divides, part passing through the condenser 14, Fig. 2 and the remainder through the crystal 1. The effect of the crystal upon the tuning is then slight. Such effect as it has upon the tuning may be further reduced by connecting a very small capacity, of a few micro-micro-farads, in series with the resonator. Often the response is sufficiently strong, even when one or both of the terminals of the resonator is entirely disconnected, the capacities between the resonator terminals and the circuit being sufficient to effect a perceptible response. By means of these capacities, the resonator is enabled to absorb enough energy to make it vibrate and to react perceptibly upon the circuit.

Figure 3:
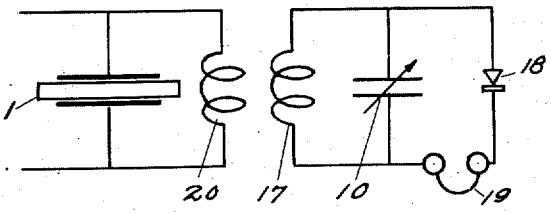

In Fig. 3, the piezo-electric resonator 1 forms part of an oscillatory circuit loosely coupled to a tuned circuit comprising a coil 17 and a condenser 10. In parallel with the latter, is a detector 18 and a telephone receiver 19, or some other indicating device may be properly connected with the circuit. When the resonator is connected in parallel with the coil 20 in the first circuit and the frequency of the alternating current is varied through the critical value, the sudden reaction of the resonator upon the current in 20 produces an audible click in the telephone 19. It is not generally necessary that the circuit of coil 17 should be in exact tune with that containing 20.

Figure 4:
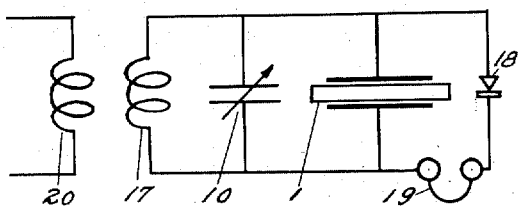

Fig. 4 illustrates the same plan as the preceding figure, but, in this case, the piezo-electric resonator is in parallel with the condenser 10 in the receiving circuit, instead of being in parallel with coil 20.

The operation is the same as described in connection with Fig. 3, except that the crystal reacts upon the receiving circuit, comprising the coil 17 and the condenser 10.

This connection of the resonator in parallel with the capacity in a secondary circuit is found, in practice, to be the best when the circuit is used for the standardizing of frequency. The tuning condenser in parallel with the crystal and the resistance of the circuit should have as low values as possible.

Fig. 5 is similar to Figs. 3 and 4, except that, instead of the detector and the telephone, there is shown a high-frequency ammeter 21.

By varying the frequency of the current in coil 20, and keeping the secondary circuit, which comprises the coil 17 and a variable condenser 10, in electrical resonance with the current in 20, it is possible to observe quantitatively the manner in which the current in the ammeter passes through a minimum at the critical frequency, and to determine the settings of condensers and other instruments corresponding to this frequency, with a high degree of precision.

For many purposes, it is immaterial whether the crystal is in the oscillatory circuit comprising the coil 20, as shown in Fig. 3, or in the circuit comprising the coil 17, as in Figs. 4 and 5. When the highest precision is sought, however, it is better to include the crystal in a different circuit from that which it is desired to standardize. With the crystal connected as in Fig. 3 or 4, the operation of tuning the generating circuit comprising the coil 20, so as to bring it into synchronism with the natural frequency of the resonator, is as follows: When the frequency of the current in the coil 20 passes through the critical value, the crystal is set into vibration, and it continues vibrating for a fraction of a second even after the frequency of the impressed alternating current has assumed a different value. The crystal, by its vibrations, generates a piezo-electro-motive force, and two frequencies are then present in the secondary circuit:—one, that of the impressed alternating current as determined by the electrical constants of the circuit; and the other, that of the vibrating crystal. If the frequencies of these two currents are near each other,—they may differ, say, to the extent of a few hundred cycles,—the currents will combine, according to the heterodyne principle, to produce a beat-note of musical quality, which may be detected in the telephone receiver 19 as the before-mentioned click. The pitch and duration of the beat note depend upon the extent to which the frequency is varied after the resonator has been set into vibration, and also upon the rate at which the vibrations of the resonator die away. If this rate is very rapid, then, on varying the frequency through the critical value, only a short click, instead of a beat note of recognizable pitch, will be heard. This phenomenon is described in my paper above-mentioned, particularly page 109.

When the resonator is used as a frequency standard, connected to a secondary circuit as in Figs. 2, 4 or 5, the indicating device is, as a rule, either a current-measuring device in the main circuit, like the ammeter in Figs. 2 and 5, or else a potential-operated device, like the detector and telephone receiver in Fig. 4. In the case of Figs. 2 and 5 the current flowing through the indicating device sinks to a simple minimum at the natural frequency of the resonator. These facts are explained more at length in my said paper, particularly in connection with Fig. 5 of that paper and on page 101.

Figure 6:
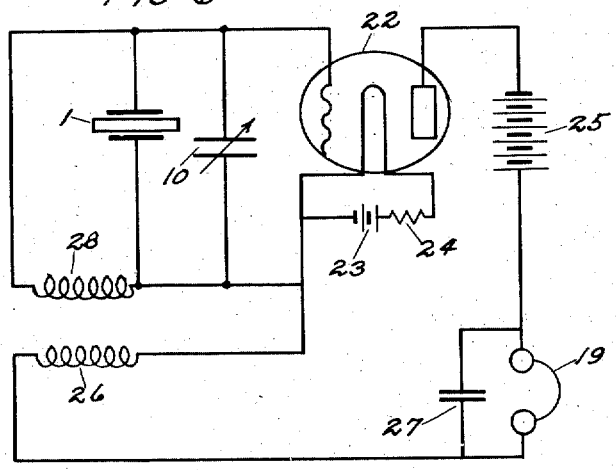

Fig. 6 represents a form of circuit in common use for generating high-frequency currents by means of a three-element vacuum tube 22. In this figure 23 and 24 represent, respectively, the battery and the regulating resistance in the filament circuit; and 25 is the plate battery. A telephone receiver 19 has a fixed capacity 27 in parallel with it and 26 is the feedback coil, which is coupled to coil 28 in the grid circuit. Condenser 10, in parallel with coil 28, is used to control the frequency. This circuit, too, may be employed, in combination with the resonator, as a frequency standard. The piezo-electric resonator is in parallel with the condenser 10 and its capacity is so small as not to introduce a perceptible error.

Currents of varying frequency may be obtained by varying the capacity of the condenser 10. Whenever the frequency passes through the natural frequency of vibration of the resonator, the latter is set into vibration. As long as these vibrations continue, there will be two frequencies present in the system; one due to the electrical tuning, as determined by the setting of the condenser 10, and the other due to the vibration of the resonator. The two frequencies will, as before described, cause a beat note to be heard in the receiver 19. In many cases, moreover, it is possible to detect the resonant frequency with a very loose coupling of the resonator, as when only one side of the resonator is connected, or even when both sides are disconnected, as above described. In such cases, of course, the crystal is nevertheless connected with the circuit through the minute capacities between the resonator terminals and adjacent portions of the circuit.

The above-mentioned beat note is heard both when the capacity of the condenser 10 is increased, thus decreasing the frequency, and when the said capacity is decreased, thus increasing the frequency. The two settings of the condenser 10 at which the clicks or beats occur are not exactly the same for they occur at the breaks 3 and 5, Fig. 6 of Patent No. 1,472,583. Their mean may be taken as the setting corresponding to the crystal frequency, for they are both exceedingly close to the natural frequency of mechanical vibration of the crystal. By using a narrow crystal, or by disconnecting one or both terminals, the reaction of the crystal upon the circuit may be lessened. The clicks, though thus made fainter, are nevertheless amply loud and sharp, while the two condenser settings may thus be brought so close together as to be practically indistinguishable. Even when a large crystal is employed, so that the settings of the condenser 10 are made wide apart, the clicks still occur close to the natural frequency of the crystal. The wider apart the condenser settings are, the better will the crystal act as a stabilizer, as described in the said Patent No. 1,472,583. At the frequency at which the click occurs, or, at least, at a frequency very close to this frequency, the current is at a minimum in the coils 26 and 28 and in the condenser 10. The current to the crystal itself, on the other hand, may be at a minimum or a maximum at, or close to, the click, depending upon whether the frequency is decreasing or increasing. The circuit of Fig. 6 constitutes a very good frequency-meter circuit.

In the description and illustrations given above, I have assumed that a supply of undamped alternating current is available. While the best results are obtained in this way, it is possible to use the resonator as a standard of wave length also when damped waves only are available, as for example, from a buzzer circuit. The reaction is then much less pronounced, owing to the fact that a damped train of waves contains, not a single frequency, but a combination of many frequencies. If, however, damped waves must be used, it is best to make the decrement as small as possible, for example, by the use of impact excitation. Some of the circuits above described, as for example, the circuit shown in Fig. 4, or proper modifications of them, may then be employed.

While the fundamental frequency of the plate or rod will usually give the strongest reaction, the various overtone vibrations can also be employed, giving reactions at frequencies approximately two, three or more times the fundamental. Or, if the plate has other dimensions comparable with its length, or if some other shape than that of a plate is used, some other mode of vibration, giving a still different frequency, may be utilized. When the vibrating unit has once been suitably prepared and mounted, its resonant frequencies are, to a high degree of precision, fixed for all time.

It will be understood that the invention is not restricted to the exact embodiments thereof that are illustrated and described herein, as other modifications will readily occur to persons skilled in the art, and all such are considered to fall within the spirit and scope of the invention, as defined in the appended claims.

What I claim as my invention is:

1. The method of indicating the frequency of current flowing in an alternate current circuit which comprises impressing said current upon a frequency standard member having a natural period of mechanical vibration, reducing the current flowing at a frequency equal to that of the natural period of the member, and indicating the said reduction in current.

2. A frequency indicating device comprising a circuit adapted to be traversed by an alternating current of unknown frequency, a piezo-electric body connected to said circuit, said body being adapted to be stimulated mechanically by an alternating current of a predetermined frequency only and to react electrically upon said circuit when so stimulated, and means to indicate said reaction.

3. A frequency indicating device comprising an alternating-current circuit in which currents of different frequencies are adapted to flow, an electro-mechanical vibrator connected to said circuit, said vibrator having one or more definite natural frequencies of mechanical vibration, the vibrator being adapted to vibrate mechanically when stimulated electrically and to respond electrically when vibrated mechanically and to react upon the current flowing in the circuit, the vibrator being so designed as to be set into vibration by energy derived from the circuit at one of the said frequencies, and means for indicating the said reaction.

4. A frequency indicating device comprising an alternating-current system, a piezo-electric body so designed that a natural frequency of mechanical vibration of the body shall be substantially equal to a predetermined frequency of the current flowing in the system, said body being connected to said system whereby the body will react electrically upon the current at substantially the predetermined frequency, and means for indicating the electrical reaction.

5. A frequency indicating device comprising an alternating-current circuit, a piezo-electric body so designed that a natural frequency of mechanical vibration of the body shall be substantially equal to a predetermined frequency of the current flowing in the circuit, said body being connected to said circuit whereby the body will react electrically upon the current at the predetermined frequency, means for mounting the body so that its mechanical vibrations shall be damped to substantially the least possible extent, and means for indicating the electrical reaction.

6. A frequency indicating device comprising an alternating-current circuit, an electro-mechanical vibrator loosely coupled to the circuit, the vibrator being adapted to respond electrically when vibrated mechanically and being so designed as to react electrically upon the current flowing in the circuit at a predetermined frequency of the current, and means for indicating the reaction.

7. A frequency indicating device comprising an alternating-current circuit, an electro-mechanical vibrator loosely coupled to the circuit, the vibrator being adapted to vibrate mechanically when stimulated electrically and to respond electrically when vibrated mechanically, and being so designed as to react electrically upon the current flowing in the circuit at a predetermined frequency of the current, and means for indicating the reaction.

8. A frequency indicating device comprising an alternating-current circuit, a piezo-electric body loosely coupled to the circuit, the body being so designed as to react electrically upon the current flowing in the circuit at a predetermined frequency of the current, and means for detecting the reaction.

9. A frequency indicating device comprising an alternating-current system having a reactance, an electro-mechanical vibrator adapted to respond electrically when vibrated mechanically, the vibrator being connected in parallel with the reactance and so designed that it shall react electrically upon the current flowing in the system at a predetermined frequency of the current, and means for indicating the electrical reaction.

10. A frequency indicating device comprising an alternating-current system having a reactance, an electro-mechanical vibrator connected in parallel with the reactance, the vibrator being adapted to vibrate mechanically when stimulated electrically from said system and to respond electrically when vibrated mechanically, and means for gradually varying the reactance, whereby the setting of the reactance may be determined with a high degree of precision.

11. A frequency indicating device comprising an alternating-current system having a reactance, a piezo-electric body connected in parallel with the reactance and so designed that it shall react electrically upon the current flowing in the system at a predetermined frequency of the current, and means for detecting the electrical reaction of the body upon the current.

12. A frequency indicating device comprising an alternating-current circuit having a variable reactance, whereby the system may be tuned, an electro-mechanical vibrator for reducing the flow of current in the system, the vibrator being adapted to vibrate mechanically when stimulated electrically and to respond electrically when vibrated mechanically, the vibrator being connected in parallel with the said reactance and being so designed that a natural frequency of mechanical vibration of the vibrator shall be substantially equal to the frequency of the current, and means for indicating the response.

13. A frequency indicating device comprising an alternating-current secondary circuit in which currents of variable frequency are adapted to be received, an electro-mechanical vibrator connected in said circuit adapted to respond electrically when vibrated mechanically, the vibrator being so designed that a natural frequency of mechanical vibration of the vibrator shall be substantially equal to the frequency of the current flowing in the receiving circuit, and means for indicating the response of the vibrator.

14. A frequency indicating device comprising an alterating-current secondary circuit in which currents of variable frequency are adapted to be received, an electro-mechanical vibrator connected in said circuit adapted to be vibrated mechanically when stimulated electrically by said currents and to respond electrically when vibrated mechanically, the vibrator being so designed that a natural frequency of mechanical vibration of the vibrator shall be substantially equal to the frequency of the current flowing in the receiving circuit, and means for indicating the response of the vibrator.

15. A frequency indicating device comprising an oscillating circuit having a source of electric oscillations of variable frequency, a piezo-electric body connected to said source and designed to react electrically upon the circuit at a predetermined frequency of the oscillations of the circuit, and means for indicating the electrical reaction.

16. A frequency indicating device comprising an alternating-current system in which alternating current of predetermined frequency is adapted to flow and an electro-mechanical vibrator coupled to said system and adapted to respond electrically when vibrated mechanically by the said current, the vibrator being so designed that the frequency caused by the said electrical response of the vibrator shall produce beats with the predetermined frequency.

17. A frequency indicating device comprising an alternating-current system in which alternating current of predetermined frequency is adapted to flow. and an electro-mechanical vibrator coupled to said system and adapted to vibrate mechanically when stimulated electrically and to produce electrical oscillations when vibrated mechanically, the vibrator being so designed that the frequency caused by the vibrations of the vibrator shall be of slightly different frequency than the said predetermined frequency, whereby beats are produced therebetween.

18. A frequency indicating device comprising a primary circuit, a secondary circuit in which the frequency may be varied, an electro-mechanical vibrator connected with one of the circuits, the vibrator being adapted to vibrate mechanically when stimulated electrically and to respond electrically when vibrated mechanically, the frequency of said electrical response being substantially equal to the frequency of the current in the said one circuit, whereby a reaction is produced upon the current flowing in the second circuit, and means for indicating the reaction.

19. A frequency indicating device comprising two coupled circuits in which currents of different frequencies are adapted to flow, a piezo-electric body connected with one of the circuits, said body being adapted to be stimulated by the current flowing in one of said circuits to produce an electrical reaction upon the current flowing in the other of said circuits, and means for indicating the said reaction.

20. A frequency indicating device comprising two circuits, a piezo-electric body connected with one of the circuits, the body being so designed that a natural frequency of mechanical vibration of the body shall be substantially equal to the frequency of the alternating current of the said one circuit, the frequency in one of the two circuits being adapted to be varied, means for maintaining the other of the two circuits in electrical resonance with the current in the said one of the two circuits, and means for indicating variations in the current in the said other of the two circuits.

In testimony whereof, I hereunto affix my signature.

WALTER G. CADY.